United States Patent [19]
Joffe et al.

[11] Patent Number: 5,856,758
[45] Date of Patent: Jan. 5, 1999

[54] LOW DISTORTION DRIVER EMPLOYING POSITIVE FEEDBACK FOR REDUCING POWER LOSS IN OUTPUT IMPEDANCE THAT EFFECTIVELY MATCHES THE IMPEDANCE OF DRIVEN LINE

[75] Inventors: Daniel M. Joffe, Owens Crossroads; Robert E. Gewin, Huntsville, both of Ala.

[73] Assignee: Adtran, Inc., Huntsville, Ala.

[21] Appl. No.: 753,102

[22] Filed: Nov. 20, 1996

[51] Int. Cl.$^6$ ........................................................ H03F 1/34
[52] U.S. Cl. .............................. 330/85; 330/103; 330/104
[58] Field of Search ................................. 330/69, 85, 103, 330/104

[56] References Cited

U.S. PATENT DOCUMENTS 4,290,024  9/1981  Yokoyama ................................. 330/85

OTHER PUBLICATIONS

Wen, y., "Converting a Voltage Amp to a Transconductance Amp", *New Electronics*, vol. 14, No. 15, Jul. 28, 1981, p. 17.

*IBM Tech. Disc. Bull.*, vol. 30, No. 10, Mar. 1988, pp. 220–221.

*Primary Examiner*—Steven Mottola
*Attorney, Agent, or Firm*—Charles E. Wands

[57] ABSTRACT

A line driver with positive feedback reduces the output signal amplitude excursion required for driving a communication line, and enables the driver's output impedance to be synthesized using a reduced component value, thereby achieving a reduction in power loss through the output resistor, while simultaneously matching the effective electrical value of the driver's output impedance to the line. The line driver includes an operational amplifier having differential polarity inputs and an output. An output resistor, whose value is a fraction of the line impedance, is coupled between the amplifier output and an output node coupled to the line. A negative feedback resistor is coupled between the amplifier output and an inverting input. A further resistor is coupled between the amplifier output and a non-inverting input. The further resistor has a value of k*R, where $m=(k+1)/(k-1)$, R is the value of each of input and negative feedback resistors, and m is the ratio of the desired output resistance Rt to the value Ro of the line driver's output resistor.

22 Claims, 3 Drawing Sheets

LOW DISTORTION DRIVER EMPLOYING POSITIVE FEEDBACK FOR REDUCING POWER LOSS IN OUTPUT IMPEDANCE THAT EFFECTIVELY MATCHES THE IMPEDANCE OF DRIVEN LINE

FIELD OF THE INVENTION

The present invention relates in general to communication systems and is particularly directed to a new and improved low distortion telecommunication line driver employing positive feedback for synthesizing the driver's output impedance, achieving a reduction in power loss in the driver output impedance, while simultaneously matching the effective driver output impedance to that of the driven load.

BACKGROUND OF THE INVENTION

There are a variety of communication system applications that require extremely low distortion, highly linear signal driver components. As a non-limiting example, consider the case of a relatively long (on the order of 20–25 kft) two-wire, twisted subscriber loop pair serving a 'remote' terminal for conducting full duplex communications. In order to prevent mutual interference between the transmit and received signals, echo-canceling circuitry is installed at the respective ends of the loop. However, the performance of these components, and therefore the effective service distance of the loop, is limited by the amount of distortion introduced into the signals being transported over the two-wire pair, and the ability of the echo-canceling circuitry to precisely excise the unwanted echo of the transmitted signal and still realize a useable signal that is received from the far end equipment.

To this end, the line driver components should be extremely linear and introduce minimum distortion, with the output impedance of the line driver being defined so as to match the characteristic impedance of the line. It is especially difficult to maintain this linearity when power is restricted, as in the case where the two-wire pair is also used for powering remote customer premises equipment (e.g., DSL, ISDN equipment) from the central office.

Recent advances in loop data transmission equipment components have made it possible to reduce the power supply requirements for local digital subscriber loop circuits from supply rails on the order of ±15 volts (or a thirty volt power rail differential), to ±8 volts power supply rails (a sixteen volt power supply differential). Driving the loop with components that operate with relatively small absolute signal voltage swings (e.g., five volts peak-to-peak) relative to the power supply differential improves linearity. However, it still leaves a considerable voltage difference (e.g., eleven volts for a ±8 volts supply) between the maximum signal excursion and the supply rail differential, resulting in a substantial standby power overhead loss (the product of the standby current times the voltage difference).

To reduce this standby power loss, the power overhead can be reduced to make the supply rail differential be as close as possible to the differential signal swing. However, this power reduction objective must be balanced against the fact such an overhead reduction inherently increases the amount of distortion in the line driver amplifiers.

SUMMARY OF THE INVENTION

In accordance with the present invention, we have developed a new and improved, line driver circuit configuration employing positive feedback that reduces the required output signal amplitude excursion required for driving the line, which serves to enhance linearity, and allows the line to be driven from amplifiers which run with a lower supply voltage and therefore results in lower power dissipation. As will be described, the use of positive feedback enables the driver's output impedance to be synthesized to a higher value, while still using a smaller valued resistor, thereby achieving a reduction in IR power loss through the output resistor, and simultaneously matching the effective electrical value of the driver's output impedance to that of the driven load.

More particularly, the improved line driver circuit configuration of the present invention comprises an operational amplifier circuit having first and second differential polarity input terminals and an output terminal. The inverting or negative input terminal is coupled to ground through a first input resistor, and the non-inverting or positive input terminal is coupled through a second input resistor to a signal transmitter, which generates a source voltage. An output resistor, whose value need be only a fraction of the desired output impedance due to the positive feedback to be described, is coupled between the amplifier output terminal and an output node to which one end of the load (line) being driven is coupled.

A first, negative feedback resistor is coupled between the amplifier output terminal and its inverting (−) input terminal. Although not required, in order to facilitate the design, the negative feedback resistor may have the same value as the two input resistors. A second or further resistor is coupled between the load side of the output resistor terminal and the amplifier's non-inverting (+) input terminal. The further resistor has a value of k*R, where k is defined in terms of a quantity m, as k=(m+1)/(m−1), R is the value of each of the input and negative feedback resistors, and the quantity m is the ratio of the resistance Rt of the desired output impedance to the value Ro of the line driver's output resistor. The value Ro of the output resistor is considerably less (e.g., by at least an order of magnitude) than the value R, which is also selected so as not to cause significant loading.

As in a conventional line driver, an output voltage divider is formed by output resistor and line impedance, so that a portion of the driver's output power is undesirably wasted in the output resistor. However, unlike a conventional line driver circuit, which customarily equates the value of the driver's output resistor to that of the load and thereby undesirably wastes half the driver's output across its termination resistor, because of the dramatically lower output resistor, the amount of power dissipated across the driver's output resistor is considerably reduced; still, because of the positive feedback, the effective electrical output impedance seen at the line driver's output node is matched to the impedance Rt of the line. The output impedance presented at the driver's output node to the line is equal to the product of the quantity m times the value of the driver's output resistor Ro. Since Ro is equal to Rt/m, the output impedance Zo seen at the driver output node is equal to m*Rt/m, or simply Rt. Thus, the driver's output impedance is matched to the line impedance.

In order to facilitate the formation of bridge outputs, it is useful to have both an inverting line driver and a non-inverting line driver circuit. The inverting line driver differs from the non-inverting driver in that the input signal source is coupled to the inverting side input resistor, whereas the positive input resistor is coupled to ground. For the inverting line driver configuration, the effective output impedance is set equal to m*Ro, where m=(k+1)/(k−1).

In accordance with a modification of the non-inverting configuration, in order to provide equal positive and negative gains, that are required for a balanced bridge version of the circuit, the signal source is coupled through an input resistor having a resistance value of $R*(m+1)/m$, to the non-inverting (+) input terminal of the operational amplifier. An additional resistor having a resistance value of $R*(m+1)$, is coupled between ground and the non-inverting (+) input of the operational amplifier. The modified non-inverting configuration has an open circuit gain equal to m, and its output impedance is $m*Ro$.

To eliminate amplifier distortion arising from the common mode voltage swing, which appears at the inputs of the operational amplifier in either of the two above-described configurations, the required positive feedback is achieved with an inverting driver amplifier and an inverting feedback amplifier summed via the driver amplifier inverting input to maintain all amplifier inputs at virtual ground.

The line driver employs a combination of positive and negative feedback to set the output impedance. The line driver amplifier circuit has its non-inverting input terminal coupled to ground, while its inverting input terminal is coupled to a signal source. The amplifier's output terminal is coupled through an output resistor to an output node. A negative feedback resistor is coupled between the amplifier's output terminal and its inverting input terminal. Although not required, the negative feedback resistor may have the same value R as the input resistor, in order to facilitate the design. The load side of the output resistor is coupled through an input resistor to an inverting input terminal of a feedback, inverting operational amplifier circuit, which has its second, non-inverting input terminal coupled to ground. The output of the feedback operational amplifier is coupled through an output resistor having a value $d*R$ (where d has a lower bound of 1, assuming only positive output resistances are desired) to the first inverting input terminal of the line driver operational amplifier, thereby providing a positive feedback loop between the output of the line driver amplifier and its input. A negative feedback resistor is coupled between the feedback amplifier's output terminal and its inverting input terminal.

For $R>>Ro$, analysis of this virtual ground circuit reveals that the open circuit voltage gain is $d/(d-1)$, and the output impedance is equal to $Ro*d/(d-1)$. The output impedance may be set to a value much larger than the value of Ro. For example, for $d=\infty$, the circuit becomes equivalent to a conventional circuit, with the output impedance equal to Ro, and the open circuit gain being $-1$. For $d=1$, the output impedance is infinite and the open circuit voltage gain is infinite (a current source). For values of d between unity and infinity, the output impedance becomes a finite multiple of Ro, with a finite circuit gain of $d/(d-1)$.

DETAILED DESCRIPTION

Figure 1:
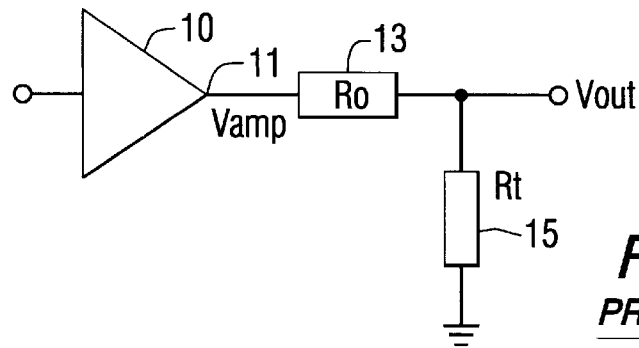
FIG. 1 diagrammatically illustrates a conventional line driver circuit in which the value of the driver amplifier's output impedance is essentially zero and, as such, the resistor Ro is set equal to that of the line.

As described above, a fundamental parametric requirement of a line driver is that its output impedance match the characteristic impedance of the line. This has been conventionally accomplished as diagrammatically illustrated in FIG. 1 by terminating the output 11 of a driver amplifier 10 with a line-coupling output resistor 13, the value Ro of which is set equal to the impedance Rt (e.g., 135 ohms, as a non-limiting example) of a load 15. The resulting voltage divider formed by output resistor 13 and line impedance 15 dissipates and therefore wastes half the driver's output power in the output impedance 13. This implies that for each volt of signal swing to be imparted to the line (load impedance 15) a two volt swing is required at the output 11 of the amplifier 10.

Pursuant to the invention, the unalterable requirement that the line driver's output impedance match that of the line is achieved, without having to terminate the amplifier output with a resistance whose value is equal to or approximates that of the line, thereby substantially reducing the amplifier's output power requirements, so as to realize a more linear line driver circuit that can operate at reduced power levels.

Figure 2:
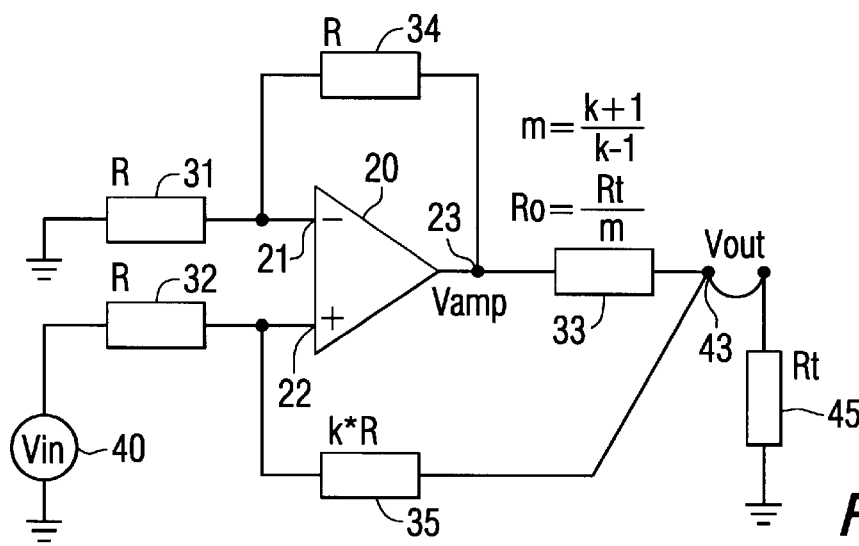
FIG. 2 diagrammatically illustrates an improved line driver circuit in accordance with a first embodiment of the present invention.

For this purpose, as shown in FIG. 2, the improved line driver circuit configuration of the present invention is diagrammatically illustrated as comprising an operational amplifier circuit 20 having first and second differential polarity input terminals, specifically, a first (−) input terminal 21 and a second (+) input terminal 22, and an output terminal 23. The first (−) input terminal 21 is coupled to a prescribed reference potential (e.g, ground (GND) potential through a first input resistor 31. The second (+) input terminal 22 is coupled through a second input resistor 32 to a signal source 40, which generates a source voltage Vin, referenced to the prescribed reference potential (GND). An output resistor 33 is coupled between the amplifier output terminal 23 and an output node 43, to which one end of the load (line) 45 being driven is coupled. The other end of the load 45 is terminated in the prescribed reference potential (GND). The terminating load 45 has some prescribed impedance value Rt.

A first, negative feedback resistor 34 is coupled between the amplifier output terminal 23 and its first (−) input terminal 21. Negative feedback resistor 34 has the same value R as the first input resistor 31 and the second input resistor 32. A second or further resistor 35 is coupled between load 43, the output resistor 33, and the amplifier's second (+) input terminal 22. The further resistor 35 has a value of $k*R$, where k is defined in terms of a quantity m, as $m=(k+1)/(k-1)$, and the quantity m is the ratio of the resistance Rt of the load 45 to the value Ro of the output resistor 33. As will be described, the value of the output resistor 33 is considerably less (e.g., by at least an order of magnitude) than the value R of each of the resistors 31, 32 and 34, and the value of R is such as to not cause significant loading.

As in the conventional line driver configuration of FIG. 1, because an output voltage divider is formed by output resistor 33 and line impedance 45, a portion of the driver's output power is undesirably wasted in the output resistor 33. However, unlike the conventional line driver circuit configuration of FIG. 1, because of the much smaller value of resistor 33 compared to resistor 13, the amount of power dissipated across output resistor 33 is considerably less than that of FIG. 1, yet owing to the positive feedback the output impedance seen at the output node 43 is matched to the impedance Rt of the line.

Figure 3:
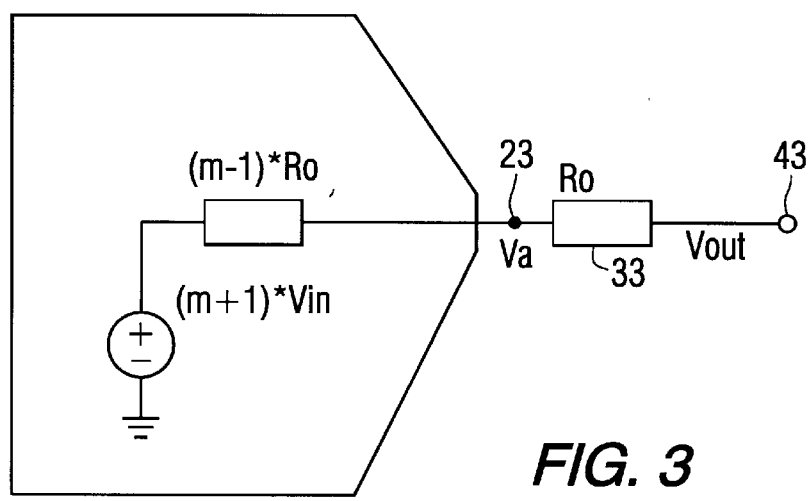
FIG. 3 is an equivalent circuit diagram of the driver configuration of FIG. 2.

More particularly, an examination of FIG. 3, which is an equivalent circuit diagram of the driver configuration of FIG. 2, reveals that the output impedance seen at output node 43 is equal to m*Ro (the value of the output resistor 33). Since Ro=Rt/m, then the output impedance at output node 43 is equal to m*Rt/m, or simply Rt, so that the output impedance at node 43 is matched to the load, as desired. In addition, the open circuit voltage is equal to the product of (m+1) times the source voltage or (m+1)*Vin.

As a non-limiting parametric example, letting k=5/3, then m=(5/3+1)/(5/3−1)=4. Therefore, since Ro=Rt/m, then Ro=Rt/4, so that only 20% of the amplifier's output power is dissipated across resistor 33, as opposed to a 50% loss in the conventional driver of FIG. 1—yielding a 40% improvement in wasted power dissipation. The output impedance is still equal to Rt, by virtue of positive feedback through the further resistor 35 (k*R).

Because the driver circuit of the present invention requires less output power, it is able to provide a larger margin between the supply rail differential and the peak-to-peak signal swing, thereby improving linearity, as described above. Non-linearity increases where the driver is required to deliver more output current to the load, with a worst case condition occurring when a high output current must be delivered with output signal swings approaching the supply rails.

To facilitate an appreciation of the improvement provided by the present invention, it is useful to compare the operation of the conventional driver configuration of FIG. 1 with that of the invention, shown in FIG. 2, with the value of m set equal to 4 (achieving a 40% improvement in power loss, as noted above) as in the above parametric example. It will be further assumed that each of amplifier 10 and amplifier 20 has the same internal circuit configuration and components and that the supply rail voltages are ±10 volts. As a further given, each amplifier is to apply an output signal swing of 4 v peak to a line impedance of 135 ohms, nominal.

As noted above, in the conventional amplifier configuration of FIG. 1, the voltage divider formed by output resistor 13 and line impedance 15 dissipates half the driver's output power in the output impedance 13, so that for a desired 4 v peak signal swing imparted to the line (load impedance 15) a voltage swing of 8 v is required at the output 11 of the amplifier 10. This 8 v signal drive requirement leaves a margin of only 2 v between the amplifier output and the supply rails.

On the other hand, for m=4 in the present example, in the line driver configuration of FIG. 2, output resistor 33 dissipates only 20% of the output power, so that amplifier 20 need only generate a 5 v signal swing. This reduced 5 v signal drive requirement for the improved driver configuration of FIG. 2 leaves a margin of 5 v between the amplifier output and the supply rails. This difference is quite substantial in the context of delivering a maximum load voltage of 4 v and maximum load current of 30 ma simultaneously to a resistive load when the output voltage reaches its peak value. Delivering 30 ma of load current with a margin of only 2 v implies that the driver's output devices must exhibit an on-resistance of less than 2 v/0.03A =67Ω. In contrast, delivering 30 ma load current with a margin of 5 v implies that the load(s) must exhibit an on-resistance of 5 v/0.03A= 167Ω, which is 2.5 times higher.

The line driver circuit in accordance with the present invention, described above, provides power savings in a number of ways, depending upon design trade-offs. For example, by leaving more margin for the output stage, smaller gain-bandwidth product (which requires less operating current) and feedback are required to maintain linear performance. Providing more margin for the output stage means that an operational amplifier with higher resistance output devices can be used. Such operational amplifiers typically exhibit lower quiescent current. By sacrificing the additional margin gained, the line driver output stage can be run on lower supply rails with output stage linearity being equivalent to a line driver operating with higher supply voltages, as will be discussed below. Finally, as detailed above, decreasing the size of the line driver's output resistor decreases the wasted IR power in that resistor by a factor of m.

As noted above, the line driver of the present invention offers the opportunity to reduce supply voltage, or maintain supply voltages with a more favorable transformer turns ratio, for the common case where a transformer is used as part of the line-matching network. The magnitude of the power supply voltage reduction or turns ratio enhancement depends upon the application. The following discussion will address three major, but non-limiting applications: 1)—a driver in unidirectional service into a controlled load impedance; 2)—a driver in unidirectional service into a load impedance with an upper bound; and 3)—a driver in transceiver service, i.—with back-to-back transceivers and no level adjustment, ii.—with back-to-back transceivers and level adjustment, and iii.—assuming a minimum distance between transceivers.

For the first case 1) of a driver in unidirectional service into a controlled load impedance, the power supply voltage can be minimized most dramatically when the line driver of the present invention is used to drive a well-controlled load impedance. As a non-limiting example, consider the case where the line driver must drive 135 ohms to a 5 volt peak, but no higher impedance load. If m is chosen to be equal to 5, then the value of the output resistor 33 in the circuit diagram of FIG. 2 will be 135/5=27 ohms. The amplifier must be therefore be capable of generating a 6 volt peak output.

In contrast, for the conventional circuit of FIG. 1, the amplifier would have to be capable of generating a 10 volt peak output. It can be seen therefore that the reduction in required output swing is a factor of 2*m/(m+1), or 1.67 to 1. The attendant reduction in the supply rail voltages will be marginally less than this factor, as some overhead must be factored in for a practical amplifier circuit. That is, assuming the need for a 2 volt margin (minimum difference between supply rail and output voltage), the conventional line driver would have required 12 volt rails. The line driver of FIG. 2 only requires 8 volt rails, which still represents a 1.5 to 1 reduction in required power supply voltages.

For the second case 2) of drivers in unidirectional service into a load impedance with an upper bound, the amplifier output swing required of the line driver of FIG. 2 increases with increasing load impedance. On the other hand, the amplifier output swing required of the conventional driver configuration of FIG. 1 is invariant with load impedance.

Both circuits require exactly the same maximum amplifier output swing when driving open circuits.

Namely, if driving an open circuit is as important as driving a terminated circuit, then both the circuit of FIG. 1 and that of FIG. 2 will require the same supply voltage (assuming ideal output stages), since an amplifier with a hard limited output voltage (which is largely independent of output current) benefits less from the configuration of FIG. 2 than an amplifier whose maximum output swing depends more on the output current delivered. However, in the real world, the line driver of the present invention offers a significant advantage, since it exhibits much greater output voltage margin when driving a termination. When driving an open circuit, its amplifier output will have to swing as much as the conventional circuit; however, under this condition, it should be noted that it is delivering no load current. If the load impedance has an upper bound, it is possible to reduce the supply voltages to the extent of the maximum output swing required with the given higher load resistance. The required amplifier output swing can be easily determined by using the equivalent circuit model of FIG. 3, described above.

Figure 4:
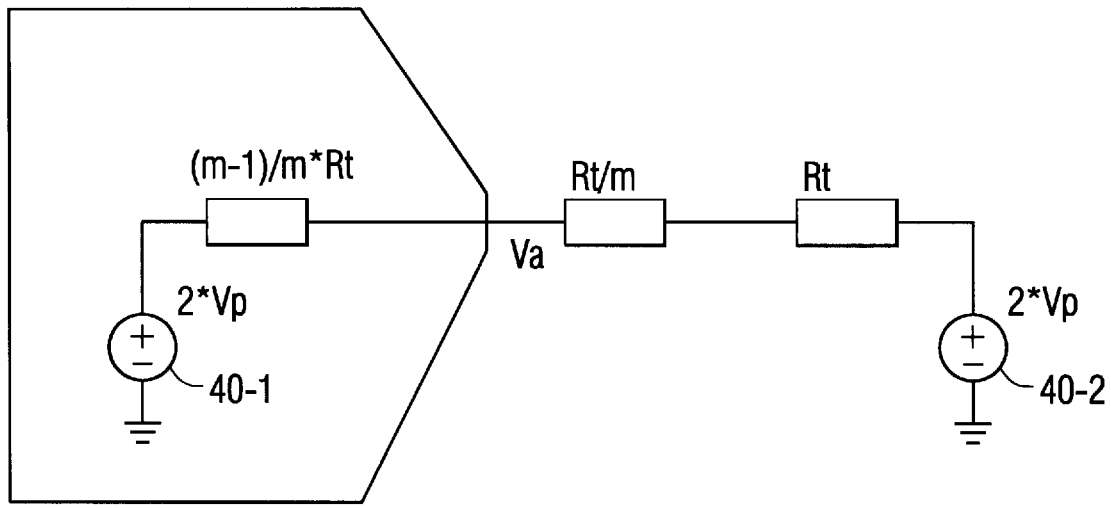
FIG. 4 diagrammatically illustrates an equivalent circuit model of a line driver having two signal sources generating the same output voltage.

For the third case 3) of a driver in transceiver service, with back-to-back transceivers and identical peak output levels, there are two sub-cases to consider. FIG. 4 diagrammatically illustrates an equivalent circuit model, with two signal sources 40-1 and 40-2 generating the same output voltage (2*Vp). No output current flows, and the required amplifier output voltage Va is the same as if there were no termination. This is the same output voltage required of the conventional line driver circuit of FIG. 1 (a fairly easy task where zero output current is required).

When the output voltages from signal sources 40-1 and 40-2 are mutually out-of-phase, the required output current increases. However, the output voltage required of the line driver of FIG. 2 decreases. In a limiting case, with equal and opposite peak outputs, both the line driver circuit of the present invention and the conventional configuration of FIG. 1 must deliver twice the peak output current that would be required when driving a passive termination. The line driver circuit of the present invention does so at an amplifier output voltage of zero volts (giving ample output stage margin). The conventional circuit does so with the minimum overhead voltage across its output devices. This is a severe test of linearity. With back-to-back signal sources, extreme linearity may not be so crucial as when the signal sources are far apart.

As a non-limiting example of the improved efficiency achieved by the line driver circuit of the present invention, consider the case of realizing an output impedance of Rt ohms. As described above, for the conventional configuration of FIG. 1, the impedance of the output resistor would be set equal Rt ohms. In the line driver configuration of FIG. 2, however, the output resistor need be set equal to only Rt/m ohms. With this choice, the power dissipated in the load is $(I_{Load})^2 Rt$. The power dissipated in the output resistor 33 is $(I_{Load})^2 Rt/m$. Thus, the amount of power wasted in impedance-determining resistances is reduced by a factor of m. The peak output voltage required of the amplifier in this case is (m+1)/m times the voltage across the load, instead of two times the voltage across the load, as required by the conventional circuit of FIG. 1, so as to reduce the magnitude of the amplifier's supply rails, saving power.

Considering a specific example where the impedance of the load resistance Rt=135 ohms and m=4, with a sinusoidal voltage being delivered at a power of +14 dBm. The peak voltage Vpeak across the load must therefore satisfy the relationship:

$$10 \log(V_{peak}^2/(2*135)/10^{-3}) = 14,$$

so that the peak voltage Vpeak must equal 2.604 volts.

In the conventional line driver configuration of FIG. 1, the driver amp would have to swing to twice this voltage, or 5.208 volts, and may require supply rails in excess of 5.208 volts. Using the line driver circuit of FIG. 2, however, the driver amplifier would only have to swing to (5/4)·2.604= 3.255 V, and would require supply rails which only need to exceed 3.255 volts.

As a further illustration, consider the case of an ideal class B amplifier, operating with a supply voltage exactly equal to the required peak amplifier output voltage in a given topology. The theoretical maximum efficiency for a sinusoid is 78.5% (π/4). Additional efficiency losses are incurred due to the impedance setting output resistances. The conventional circuit of FIG. 1 requires 63.6 milliwatts to deliver 25 milliwatts to the load.

In the conventional line driver circuit of FIG. 1, half the power is lost in the impedance setting circuit, leading to a maximum efficiency of 39%. In the line driver circuit of FIG. 2, however, only 1/m of the output power is lost to impedance setting resistances, leading to an efficiency of 78.5*0.8=62.8%. or (π/4)*(m/(m+1)). The circuit of FIG. 2 requires only 39.8 milliwatts to deliver 25 milliwatts to the load. Thus, with m=4, the line driver in accordance with the present invention saves 23.8 milliwatts compared to the conventional circuit of FIG. 1.

Figure 5:
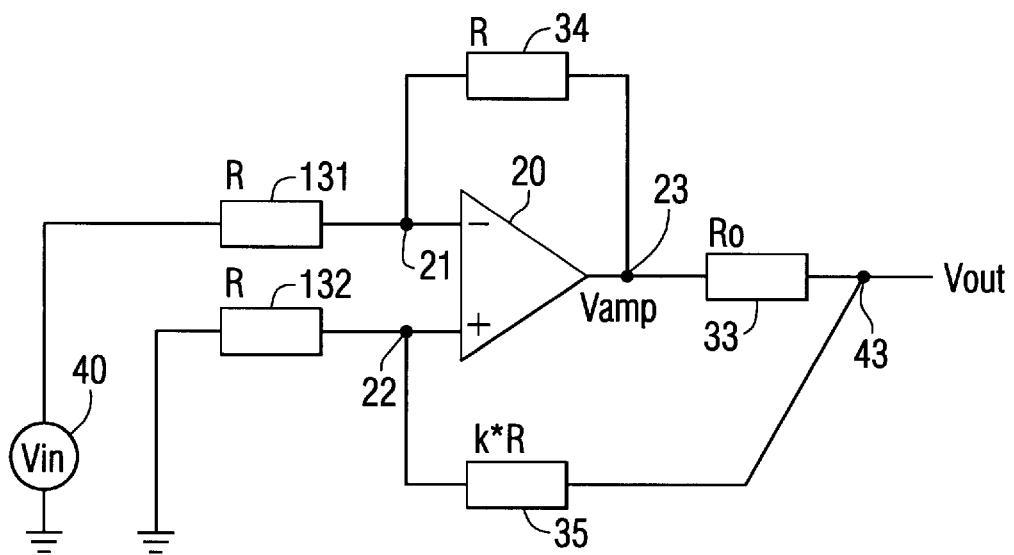
FIG. 5 diagrammatically illustrates an inverting line driver in accordance with the present invention.
Figure 6:
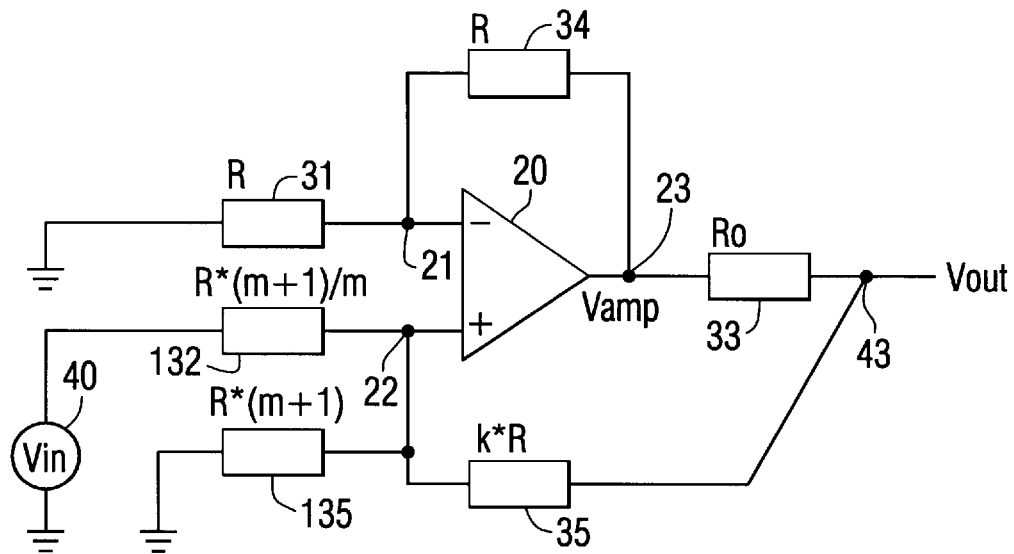
FIG. 6 diagrammatically illustrates a non-inverting line driver circuit in accordance with the present invention.

In order to facilitate the formation of bridge outputs, it is useful to have both an inverting line driver as diagrammatically illustrated in FIG. 5, and a non-inverting line driver circuit, diagrammatically illustrated in FIG. 6. FIG. 5 differs from the non-inverting diagram of FIG. 2 in that the input signal source 40 is coupled to the inverting side input resistor 31, whereas resistor 32 is coupled to ground (GND). For the inverting line driver configuration, the effective output impedance at node 43 is set equal to m*Ro, where m=(k+1)/(k−1). The open circuit gain is equal to Vout/Vin= m*(−1).

FIG. 6 diagrammatically illustrates a modification of the non-inverting configuration of FIG. 2 to provide equal positive and negative gains, that are required for a balanced bridge version of the circuit. For this purpose, the signal source 40 is coupled through an input resistor 132, having a resistance value of R*(m+1)/m, to the (+) input terminal 22 of amplifier circuit 20. An additional resistor 135, having a resistance value of R*(m+1), is coupled between ground (GND) and the positive input node 22 of amplifier 20. The remaining components and connections of FIG. 6 remain the same as those of FIG. 2. This modified non-inverting configuration also has an open circuit gain equal to m, and its output impedance is also m*Ro.

Figure 7:
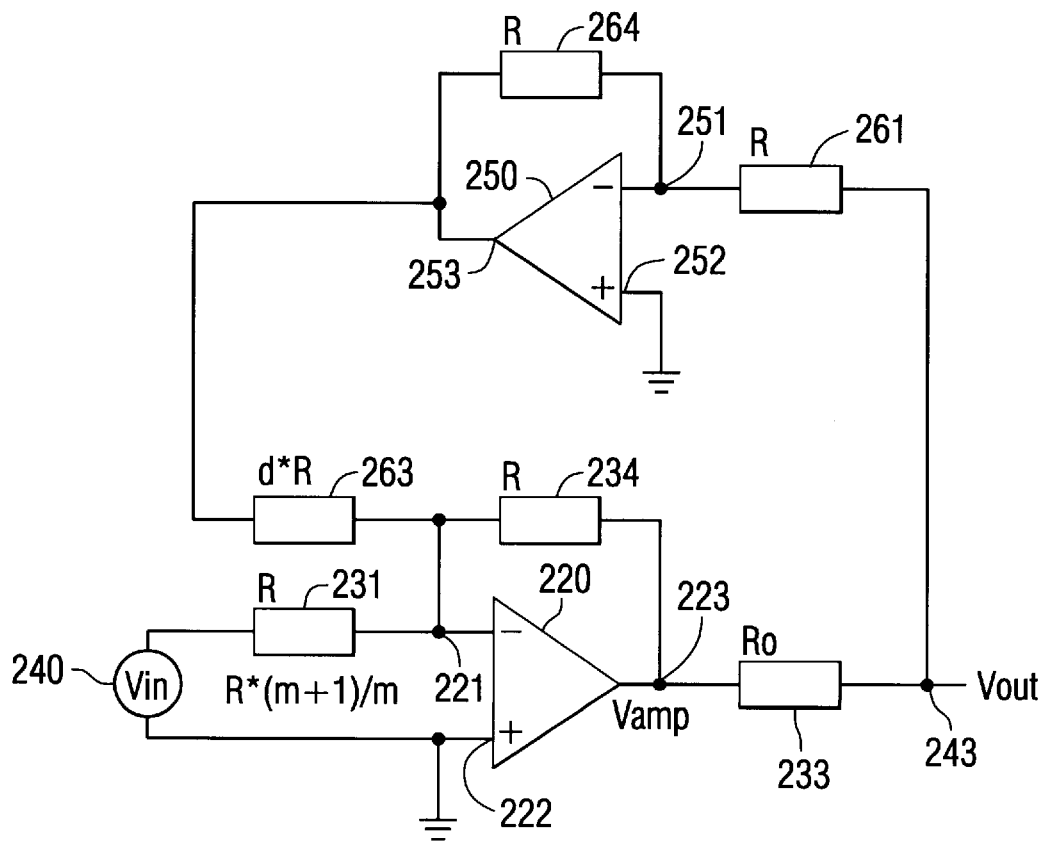
FIG. 7 diagrammatically illustrates a synthesized output impedance driver configuration in accordance with the present invention for the case that all operational amplifier inputs are at virtual ground.

In order to eliminate amplifier distortion arising from a common mode voltage swing which appears at the inputs of the non-inverting configuration of the operational amplifier, to realize the required positive feedback, an inverting amplifier driver and an inverting feedback amplifier are employed, with a summing node at the driver amplifier's inverting input, as diagrammatically shown in FIG. 7, to maintain all amplifier inputs at virtual ground. As shown therein, a first, inverting operational amplifier circuit 220 has a first (−) input terminal 221 and a second (+) input terminal 222, and an output terminal 223. The second (+) input terminal 222 is coupled to a prescribed reference potential (e.g, ground (GND) potential). The first (−) input terminal 221 is coupled to signal source 240, which generates a source voltage Vin, referenced to the prescribed reference potential (GND) through an input resistor 231. An output resistor 233 is coupled between the amplifier output terminal 223 and an output node 243.

A first, negative feedback resistor 234 is coupled between the amplifier 220's output terminal 223 and its first (−) input terminal 221. Negative feedback resistor 234 has the same value R as the input resistor 231. Output terminal 243 is coupled through an input resistor 261 to a first (−) input terminal 251 of a second, inverting feedback amplifier circuit 250, which has its second (+) input terminal 252 coupled to ground. The output 253 of operational amplifier 250 is coupled through an output resistor 263, having a value d*R (where d has a lower bound of one, assuming only positive output resistances are desired) to the first (−) input terminal 221 of operational amplifier 220, thereby providing a positive feedback loop between the output 223 of amplifier 220 and its input 221. A negative feedback resistor 264 is coupled between the amplifier 250's output terminal 253 and its (−) input terminal 251.

As described previously, assuming that R>>Ro, analysis of the virtual ground circuit configuration of FIG. 7 reveals that the open circuit voltage gain is d/(d−1), and the output impedance at node 243 is equal to Ro*d/(d−1). The output impedance may be set to a value much larger than the value of Ro. For example, for d=infinity, the circuit of FIG. 7 becomes equivalent to the conventional circuit of FIG. 1, with the output impedance equal to Ro, and the open circuit gain being −1. For d=1, the output impedance is infinite and the open circuit voltage gain is infinite (a current source). For values of d between these extremes, such as d=4/3, as a non-limiting example, the output impedance becomes 4*Ro, with an open circuit gain of −4. It will be readily appreciated that the amount of feedback may be controlled by changing the values of resistors other than as shown.

To maintain a precision output impedance Zout, while realizing large multiplying factors, the ratios of the resistors should be precisely controlled. The output impedance multiplication may be maintained up to a frequency of 1/(2*m) times the gain bandwidth product (GBW) of the operational amplifier, assuming a single pole transfer function through a unity gain cross-over frequency. The complete expression for Zout as a function of frequency (assuming zero ohms output impedance of the open loop operational amplifier) is:

$$Zout=Ro*((k+1)/(k-1))(2\ s/2\pi GBW+1)/(2\ ms/2\pi GBW+1)$$

For m=4 and an operational amplifier with 8 MHz GBW, the output impedance multiplication is effective (3 dB point) up to 1 MHz, making the improved line driver of the present invention readily realized using commercially available components.

As will be appreciated from the foregoing description, the line driver circuit configuration in accordance with the present invention, which employs positive feedback, enables the driver's output impedance to be synthesized to a reduced component value, thereby achieving a reduction in IR power loss through the output impedance, while simultaneously matching the effective electrical value of the driver's output impedance to that of the driven load. The invention reduces the required output signal amplitude excursion required for driving the line, enhancing linearity, and allows the line to be driven with a lower supply voltage, thus reducing power dissipation.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A driver amplifier circuit comprising:

an operational amplifier having first and second differential polarity inputs and an output;

a first input resistor coupling one of said first and second differential polarity inputs of said operational amplifier to a first reference potential terminal;

a second input resistor coupling another of said first and second differential polarity inputs of said operational amplifier to an input signal terminal to which an input signal is applied;

a negative feedback resistor coupled between said amplifier output and an inverting one of said first and second differential polarity inputs of said operational amplifier;

an output resistor coupled between said amplifier output and an output terminal to which a load being driven is coupled, said output resistor having a resistance Ro that is considerably less than the resistance Rt of said load; and a further resistor coupled between said output terminal and a non-inverting one of said first and second differential polarity inputs of said operational amplifier;

wherein said driver amplifier circuit has an effective output impedance that is matched to the impedance of said load.

2. A driver amplifier circuit according to claim 1, wherein said further resistor has a value of k*R, where R is the value of said negative feedback resistor, and k is defined in accordance with a prescribed relationship of the ratio of a resistance Rt of said load to the value Ro of said output resistor.

3. A driver amplifier circuit according to claim 2, wherein k is defined in terms of a quantity m, as m=(k+1)/(k−1), and the quantity m is the ratio of Rt to Ro.

4. A driver amplifier circuit according to claim 1, wherein said output resistor has a value Ro is at least an order of magnitude less than the value R of said negative feedback resistor.

5. A driver amplifier circuit according to claim 1, wherein said first input resistor couples an inverting one of said first and second differential polarity inputs of said operational amplifier to said first reference potential terminal, and wherein said second input resistor couples said non-inverting one of said first and second differential polarity inputs of said operational amplifier to said input signal terminal.

6. A driver amplifier circuit according to claim 5, further including a third input resistor coupled between said non-inverting one of said first and second differential polarity inputs of said operational amplifier to said first reference potential terminal.

7. A driver amplifier circuit according to claim 6, wherein said second and third input resistors have respective values as products of the value R of said first input resistor and an expression defined in terms of the ratio of the resistance Rt of said load to the value Ro of said output resistor.

8. A driver amplifier circuit according to claim 7, wherein said further resistor has a value of k*R, where k is defined in terms of a quantity m, as m=(k+1)/(k−1), and the quantity m is the ratio of the desired output resistance Rt to the value Ro of said output resistor.

9. A driver amplifier circuit according to claim 8, wherein said second input resistor has a value R*(m+1)/m, and wherein said third input resistor has a value R*(m+1).

10. A driver amplifier circuit according to claim 1, wherein said first input resistor couples said non-inverting one of said first and second differential polarity inputs of said operational amplifier to said first reference potential terminal, and wherein said second input resistor couples an inverting one of said first and second differential polarity inputs of said operational amplifier to said input signal terminal.

11. A driver amplifier circuit according to claim 10, wherein said further resistor has a value of k*R, where R is the value of said negative feedback resistor, and k is defined in accordance with a prescribed relationship of the desired output resistance Rt to the value Ro of said output resistor.

12. A driver amplifier circuit according to claim 11, wherein k is defined in terms of a quantity m, as m=(k+1)/(k−1), and the quantity m is the ratio of Rt to Ro.

13. A driver amplifier circuit comprising:
 a first operational amplifier having first and second differential polarity inputs and an output, said first input of said first operational amplifier being coupled through a first input resistor to an input signal terminal to which an input signal is applied, and said second input of said first operational amplifier being coupled to a reference potential terminal, a negative feedback resistor coupled between an amplifier output and said first input of said first operational amplifier, and an output resistor coupled between said amplifier output and an output terminal to which a load being driven is coupled; and
 a second operational amplifier having first and second differential polarity inputs and an output, said first input of said second operational amplifier being coupled through a first input resistor to said output terminal to which said load being driven is coupled, said second input of said second operational amplifier being coupled to a reference potential terminal, a negative feedback resistor coupled between an amplifier output and said first input of said second operational amplifier, and an output resistor coupled between said second operational amplifier output and said first input of said first operational amplifier, so as to form a positive feedback path between said output of said first operational amplifier and said first input of said first operational amplifier.

14. A driver amplifier circuit according to claim 13, wherein said feedback resistors have a value R that is greater than the value of said output resistor of said first operational amplifier, and wherein the value of the output resistor of said second amplifier is the product of d*R, where d is a multiplier coefficient, whereby the effective output impedance seen by said load being driven at said output terminal is a finite multiple of Ro.

15. A line driver comprising an operational amplifier having differential polarity inputs and an output, an output resistor whose value Ro is less than and only a fraction of a resistance Rt presented by said line, coupled between the operational amplifier output and an output node that is coupled to said line, a negative feedback resistor having a value R coupled between the operational amplifier output and an inverting input thereof, and a further resistor coupled between said output node and a non-inverting input of said operational amplifier, and wherein said further resistor has a value of k*R, where (k+1)/(k−1)=m, m being the ratio of Rt to Ro, and wherein said line driver has an effective output impedance that is matched to the impedance of said line.

16. A method of driving a communication link with a signal to be transported thereover comprising the steps of:
 (a) coupling said signal to an operational amplifier;
 (b) coupling an output of said operational amplifier through an electrical circuit element to said communication link, said electrical circuit element having an impedance less than that of a load impedance presented by said communication link to said output of said operational amplifier; and
 (c) causing the effective electrical impedance of said operational amplifier at the coupling of said electrical circuit element with said load to match said load impedance presented by said communication link, by providing positive feedback between the communication link side of said electrical circuit element and an input of said operational amplifier.

17. A method according to claim 16, wherein said operational amplifier includes a negative feedback resistor coupled between its output and an input thereof.

18. A method according to claim 17, wherein said electrical circuit element comprises an output resistor having a resistance Ro less than a resistance Rt presented by said communication link to said output of said operational amplifier, and wherein step (c) includes coupling a further resistor between a connection of said output resistor with said communication link and a non-inverting one of first and second differential polarity inputs of said operational amplifier, said further resistor having a value of k*R, where R is the value of said negative feedback resistor, and k is defined in accordance with a prescribed relationship of the ratio of the resistance Rt presented by said communication link and the value Ro of said output resistor, such that the effective electrical value of the driver's output impedance matches that of said communication link.

19. A method according to claim 18, wherein k is defined in terms of a quantity m, as m=(k+1)/(k−1), and the quantity m is the ratio of Rt to Ro.

20. A method according to claim 19, wherein said output resistor value Ro is at least an order of magnitude less than the value R of said negative feedback resistor.

21. A method according to claim 18, wherein step (c) further comprises coupling, between said non-inverting one of said first and second differential polarity inputs of said operational amplifier and a reference potential terminal, a resistor having a value corresponding to a product of the value R of said feedback resistor and an expression defined in terms of the ratio of Rt to Ro.

22. A method according to claim 21, wherein said resistor coupled between said non-inverting one of said first and second differential polarity inputs of said operational amplifier and said reference potential terminal has a value R*(m+1).

* * * * *